United States Patent
Gutman et al.

(10) Patent No.: US 10,530,315 B2
(45) Date of Patent: *Jan. 7, 2020

(54) CALIBRATING A POWER AMPLIFIER SUCH AS IN A REMOTE UNIT IN A WIRELESS DISTRIBUTION SYSTEM (WDS)

(71) Applicant: Corning Optical Communications LLC, Hickory, NC (US)

(72) Inventors: Amit Gutman, Herzliya (IL); Shlomi Kaduri, Herzliya (IL); Roi Yosy Ziv, Ramat Gan (IL)

(73) Assignee: Corning Optical Communications LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/382,504

(22) Filed: Apr. 12, 2019

(65) Prior Publication Data
US 2019/0245495 A1     Aug. 8, 2019

Related U.S. Application Data

(63) Continuation of application No. 15/964,755, filed on Apr. 27, 2018, now Pat. No. 10,298,185, which is a
(Continued)

(51) Int. Cl.
*H03F 3/19* (2006.01)
*H04B 17/13* (2015.01)
(Continued)

(52) U.S. Cl.
CPC ............. *H03F 3/19* (2013.01); *H03F 1/0261* (2013.01); *H03F 3/245* (2013.01); *H03F 3/68* (2013.01);
(Continued)

(58) Field of Classification Search
CPC .... H03F 1/0261; H03F 2200/451; H03F 3/19; H03F 3/245; H03F 3/68; H04B 17/13;
(Continued)

(56) References Cited

U.S. PATENT DOCUMENTS 5,426,641 A    6/1995  Afrashteh et al.
5,625,322 A *  4/1997  Gourgue ............... H03F 1/0261
                                               330/129
(Continued)

FOREIGN PATENT DOCUMENTS

| WO | 0237673 A1 | 5/2002 |
| WO | 2016105060 A1 | 6/2016 |
| WO | 2016108647 A1 | 7/2016 |

*Primary Examiner* — Tan H Trinh
(74) *Attorney, Agent, or Firm* — C. Keith Montgomery

(57) ABSTRACT

Embodiments of the disclosure relate to calibrating a power amplifier. The power amplifier calibration circuit is configured to provide a plurality of bias signal combinations each including a respective first bias signal and a respective second bias signal to the power amplifier. Power amplifier performance parameters for each of the bias signal combinations can be measured and provided to a control circuit in the power amplifier calibration circuit. The control circuit is configured to rank the measured power amplifier performance parameters based on predefined ranking criteria and determines a selected bias signal combination that can optimize the power amplifier performance parameters of the power amplifier. As such, it is possible to calibrate the power amplifier to operate at a balanced performance level, thus helping to improve radio frequency (RF) coverage and performance of the remote unit in a wireless distribution system (WDS).

19 Claims, 9 Drawing Sheets

Related U.S. Application Data continuation of application No. 15/621,188, filed on Jun. 13, 2017, now Pat. No. 10,116,264.

(60) Provisional application No. 62/513,057, filed on May 31, 2017.

(51) Int. Cl.
| | |
|---|---|
| *H03F 3/68* | (2006.01) |
| *H03F 3/24* | (2006.01) |
| *H03F 1/02* | (2006.01) |
| *H04W 24/02* | (2009.01) |

(52) U.S. Cl.
CPC ............ *H04B 17/13* (2015.01); *H04W 24/02* (2013.01); *H03F 2200/451* (2013.01)

(58) Field of Classification Search
CPC ........ H04W 24/02; F02B 33/40; F02B 37/24; F02B 39/12; F02B 39/16; F02B 75/048; F02D 15/02; F02D 23/005
USPC ............ 455/69, 522, 127.1, 341, 250, 114.2, 455/111.3, 73, 105; 330/129, 227; 327/538
See application file for complete search history.

(56) References Cited

U.S. PATENT DOCUMENTS

| | | |
|---|---|---|
| 6,208,497 B1 | 3/2001 | Seale et al. |
| 6,351,189 B1 | 2/2002 | Hirvilampi |
| 7,565,117 B2 | 7/2009 | Sugar et al. |
| 7,994,847 B1 | 8/2011 | Signoff et al. |
| 8,731,464 B2 | 5/2014 | Alkan |
| 9,397,616 B2 | 7/2016 | Donati et al. |
| 9,559,806 B2 | 1/2017 | Zhuang et al. |
| 9,729,255 B1 | 8/2017 | Rohdin et al. |
| 9,825,595 B2 | 11/2017 | Lee |
| 9,866,414 B2 | 1/2018 | Kim et al. |
| 2003/0112068 A1 | 6/2003 | Kenington |
| 2003/0164735 A1 | 9/2003 | Julien et al. |
| 2004/0075494 A1 | 4/2004 | Klomsdorf et al. |
| 2005/0270095 A1 | 12/2005 | Burke et al. |
| 2006/0116087 A1 | 6/2006 | Sugar et al. |
| 2007/0183531 A1 | 8/2007 | Ahmed et al. |
| 2008/0070512 A1 | 3/2008 | Palaskas et al. |
| 2009/0021300 A1* | 1/2009 | Romano ............ G01R 31/2822 330/2 |
| 2009/0179698 A1 | 7/2009 | Ichitsubo et al. |
| 2010/0073088 A1 | 3/2010 | Wimpenny et al. |
| 2010/0315064 A1 | 12/2010 | Kuthi et al. |
| 2011/0255575 A1 | 10/2011 | Zhu et al. |
| 2013/0130750 A1 | 5/2013 | Chang et al. |
| 2013/0344825 A1 | 12/2013 | Ripley et al. |
| 2014/0015604 A1 | 1/2014 | Eschlboeck et al. |
| 2014/0051373 A1 | 2/2014 | Klomsdorf et al. |
| 2015/0009980 A1 | 1/2015 | Modi et al. |
| 2015/0035605 A1* | 2/2015 | Lam .......................... H03F 3/19 330/296 |
| 2015/0180426 A1 | 6/2015 | Kingsley |
| 2015/0180518 A1 | 6/2015 | Whittaker |
| 2015/0270806 A1 | 9/2015 | Wagh et al. |
| 2015/0381124 A1 | 12/2015 | Joly et al. |
| 2016/0013767 A1* | 1/2016 | Lin ....................... H03F 1/0222 330/251 |
| 2016/0072530 A1* | 3/2016 | El-Hassan ............. H03F 1/0227 455/114.2 |
| 2016/0094192 A1 | 3/2016 | Khesbak et al. |
| 2016/0241195 A1 | 8/2016 | Lehtola et al. |
| 2016/0344350 A1 | 11/2016 | Khasnis et al. |
| 2017/0093339 A1 | 3/2017 | Wu et al. |
| 2018/0262166 A1 | 9/2018 | Takagi et al. |

* cited by examiner

| | SECOND BIAS WORD | FIRST BIAS WORD | IMD3 (dBm) | ACPR (dB) | IMD3 MARGIN (dB) | ACPR MARGIN (dB) | SCALED IMD3 MARGIN (dB) | SCALED ACPR MARGIN (dB) | MINIMAL MARGIN (dB) |
|---|---|---|---|---|---|---|---|---|---|
| 304(1) | 126 | 169 | -13.6 | -48.2 | -4.4 | -1.8 | -4.4 | -1.8 | -4.4 |
| 304(2) | 126 | 171 | -13.3 | -47.9 | -4.7 | -2.1 | -4.7 | -2.1 | -4.7 |
| 304(3) | 126 | 173 | -13.6 | -48.0 | -4.4 | -2.0 | -4.4 | -2.0 | -4.4 |
| 304(4) | 126 | 175 | -13.6 | -47.9 | -4.4 | -2.1 | -4.4 | -2.1 | -4.4 |
| 304(5) | 127 | 169 | -14.9 | -49.8 | -3.1 | -0.2 | -3.1 | -0.2 | -3.1 |
| 304(6) | 127 | 171 | -15.8 | -49.3 | -2.2 | -0.7 | -2.2 | -0.7 | -2.2 |
| 304(7) | 127 | 173 | -16.0 | -49.1 | -2.0 | -0.9 | -2.0 | -0.9 | -2.0 |
| 304(8) | 127 | 175 | -16.0 | -48.9 | -2.0 | -1.1 | -2.0 | -1.1 | -2.0 |
| 304(9) | 128 | 169 | -17.2 | -50.1 | -0.8 | 0.1 | -0.8 | 0.1 | -0.8 |
| 304(10) | 128 | 171 | -17.3 | -50.1 | -0.7 | 0.1 | -0.7 | 0.1 | -0.7 |
| 304(11) | 128 | 173 | -17.3 | -49.8 | -0.7 | -0.2 | -0.7 | -0.2 | -0.7 |
| 304(12) | 128 | 175 | -17.4 | -49.6 | -0.6 | -0.4 | -0.6 | -0.4 | -0.6 |
| 304(13) | 129 | 169 | -19.2 | -51.3 | 1.2 | 1.3 | 1.2 | 1.3 | 1.2 |
| 304(14) | 129 | 171 | -19.4 | -51.0 | 1.4 | 1.0 | 1.4 | 1.0 | 1.0 |
| 304(15) | 129 | 173 | -19.5 | -50.6 | 1.5 | 0.6 | 1.5 | 0.6 | 0.6 |
| 304(16) | 129 | 175 | -18.4 | -51.8 | 0.4 | 1.8 | 0.4 | 1.8 | 0.4 |
| 304(17) | 130 | 169 | -19.3 | -52.3 | 1.3 | 2.3 | 1.3 | 2.3 | 1.3 |
| 304(18) | 130 | 171 | -19.7 | -52.1 | 1.7 | 2.1 | 1.7 | 2.1 | 1.7 |
| 304(19) | 130 | 173 | -20.0 | -51.9 | 2.0 | 1.9 | 2.0 | 1.9 | 1.9 |
| 304(20) | 130 | 175 | -20.3 | -51.5 | 2.3 | 1.5 | 2.3 | 1.5 | 1.5 |
| ... | ... | ... | ... | ... | ... | ... | ... | ... | ... |
| 304(N) | 131 | 175 | -18.7 | -51.8 | 0.7 | 1.8 | 0.7 | 1.8 | 0.7 |

FIG. 5

CALIBRATING A POWER AMPLIFIER SUCH AS IN A REMOTE UNIT IN A WIRELESS DISTRIBUTION SYSTEM (WDS)

RELATED APPLICATIONS

This application is a continuation of U.S. application Ser. No. 15/964,755, filed Apr. 27, 2018, which is a continuation of U.S. application Ser. No. 15/621,188, filed Jun. 13, 2017, which claims the benefit of priority under 35 U.S.C. § 119 of U.S. Provisional Application No. 62/513,057, filed May 31, 2017, the contents of which are relied upon and incorporated herein by reference in their entireties.

BACKGROUND

The disclosure relates generally to reducing radio frequency (RF) interference and more particularly to reducing RF interference in uplink RF communications signals in a remote unit in a wireless distribution system (WDS), such as a distributed antenna system (DAS).

Wireless customers are increasingly demanding digital data services, such as streaming video signals. At the same time, some wireless customers use their wireless communications devices in areas that are poorly serviced by conventional cellular networks, such as inside certain buildings or areas where there is little cellular coverage. One response to the intersection of these two concerns has been the use of DASs. DASs include remote units configured to receive and transmit communications signals to client devices within an antenna range of the remote units. DASs can be particularly useful when deployed inside buildings or other indoor environments where the wireless communications devices may not otherwise be able to effectively receive RF signals from a source.

In this regard, FIG. 1 illustrates a distribution of communications services to remote coverage areas 100(1)-100(N) of a WDS provided in the form of a DAS 102, wherein 'N' is the number of remote coverage areas. These communications services can include cellular services, wireless services, such RF identification (RFID) tracking, Wireless Fidelity (Wi-Fi), local area network (LAN), and wireless LAN (WLAN), wireless solutions (Bluetooth, Wi-Fi Global Positioning System (GPS), signal-based, and others) for location-based services, and combinations thereof, as examples. The remote coverage areas 100(1)-100(N) may be remotely located. In this regard, the remote coverage areas 100(1)-100(N) are created by and centered on remote units 104(1)-104(N) connected to a central unit 106 (e.g., a head-end equipment, a head-end controller, or a head-end unit). The central unit 106 may be communicatively coupled to a signal source 108, for example, a base transceiver station (BTS) or a baseband unit (BBU). In this regard, the central unit 106 receives downlink communications signals 110D from the signal source 108 to be distributed to the remote units 104(1)-104(N). The remote units 104(1)-104(N) are configured to receive the downlink communications signals 110D from the central unit 106 over a communications medium 112 to be distributed to the respective remote coverage areas 100(1)-100(N) of the remote units 104(1)-104(N). Each of the remote units 104(1)-104(N) may include an RF transmitter/receiver and a respective antenna 114(1)-114(N) operably connected to the RF transmitter/receiver to wirelessly distribute the communications services to client devices 116 within the respective remote coverage areas 100(1)-100(N). The remote units 104(1)-104(N) are also configured to receive uplink communications signals 110U from the client devices 116 in the respective remote coverage areas 100(1)-100(N) to be distributed to the signal source 108. The size of each of the remote coverage areas 100(1)-100(N) is determined by the amount of RF power transmitted by the respective remote units 104(1)-104(N), receiver sensitivity, antenna gain, and RF environment, as well as by RF transmitter/receiver sensitivity of the client devices 116. The client devices 116 usually have a fixed maximum RF receiver sensitivity, so that the above-mentioned properties of the remote units 104(1)-104(N) mainly determine the size of the respective remote coverage areas 100(1)-100(N).

To provide adequate RF coverage in the remote coverage areas 100(1)-100(N), each of the remote units 104(1)-104(N) may include one or more power amplifiers to amplify the downlink communications signals 110D prior to transmitting to the client devices 116. Each of the power amplifiers employed in the remote units 104(1)-104(N) may be configured to amplify the downlink communications signals 110D to a respective power level, depending on an intended coverage range of the downlink communications signals 110D. In this regard, some of the power amplifiers may be low-power power amplifiers that can amplify the downlink communications signals 110D up to 20 decibel-milliwatts (dBm), while some other power amplifiers may be high-power power amplifiers capable of amplifying the downlink communications signals 110D to more than 30 dBm. Notably, the high-power power amplifiers may be less linear compared to the low-power power amplifiers. As a result, the high-power power amplifiers may be more prone to generating intermodulation products and/or adjacent channel interference in the amplified downlink communications signals 110D. As such, it may be desired to improve linearity in the power amplifiers, especially in the high-power power amplifiers.

No admission is made that any reference cited herein constitutes prior art. Applicant expressly reserves the right to challenge the accuracy and pertinency of any cited documents.

SUMMARY

Embodiments of the disclosure relate to calibrating a power amplifier. For example, the calibrated power amplifier may be employed in a remote unit in a wireless distribution system (WDS) configured to distribute wireless communications signals. A remote unit in a WDS employs a power amplifier to amplify a radio frequency (RF) communications signal before distributing the RF communications signals to client devices. The power amplifier is calibrated to optimize one or more power amplifier performance parameters. In exemplary aspects disclosed herein, the power amplifier can be calibrated to optimize a third-order intermodulation (IMD3) and an adjacent channel power ratio (ACPR) by adjusting a first bias signal and a second bias signal provided to the power amplifier. In this regard, in exemplary aspects disclosed herein, a power amplifier calibration circuit is provided. The power amplifier calibration circuit is configured to provide a plurality of bias signal combinations each including a respective first bias signal and a respective second bias signal to the power amplifier. Power amplifier performance parameters for each of the bias signal combinations can be measured and provided to a control circuit in the power amplifier calibration circuit. The control circuit is configured to rank the measured power amplifier performance parameters based on predefined ranking criteria and determines a selected bias signal combination that can optimize the power amplifier performance parameters of the power amplifier. By determining the selected bias signal combination that optimizes the power amplifier performance parameters, it is possible to calibrate the power amplifier to operate at a balanced performance level, thus helping to improve RF coverage and performance of the remote unit in the WDS.

In this regard, in one aspect, a power amplifier calibration circuit is provided. The power amplifier calibration circuit includes a power amplifier comprising a signal input, a signal output, a first bias signal input, and a second bias signal input. The power amplifier is configured to receive an input signal having a first power at the signal input. The power amplifier is also configured to receive a first bias signal at the first bias signal input. The power amplifier is also configured to receive a second bias signal at the second bias signal input. The power amplifier is also configured to amplify the input signal to generate an output signal having a second power higher than the first power at the signal output. The power amplifier is also configured to control a first power amplifier performance parameter and a second power amplifier performance parameter in the output signal based on the first bias signal and the second bias signal. The power amplifier calibration circuit also includes a control circuit. The control circuit is configured to provide a plurality of bias signal combinations to the power amplifier. Each of the plurality of bias signal combinations includes a respective first bias signal and a respective second bias signal to be provided to the first bias signal input and the second bias signal input of the power amplifier, respectively. The control circuit is also configured to receive a plurality of performance indication signals including a plurality of measurements corresponding to the plurality of bias signal combinations, respectively. Each of the plurality of measurements includes the first power amplifier performance parameter and the second power amplifier performance parameter. The control circuit is also configured to rank the plurality of measurements based on a predefined ranking criteria. The control circuit is also configured to determine a selected bias signal combination among the plurality of bias signal combinations corresponding to a selected ranked measurement among the plurality of measurements.

In another aspect, a method for calibrating a power amplifier is provided. The method includes providing a plurality of bias signal combinations to a power amplifier configured to amplify an input signal to generate an output signal. Each of the plurality of bias signal combinations includes a respective first bias signal and a respective second bias signal to be provided to the power amplifier for controlling a first power amplifier performance parameter and a second power amplifier performance parameter in the output signal, respectively. The method also includes receiving a plurality of performance indication signals including a plurality of measurements corresponding to the plurality of bias signal combinations, respectively. Each the plurality of measurements includes a measurement of the first power amplifier performance parameter and a measurement of the second power amplifier performance parameter. The method also includes ranking the plurality of measurements based on a predefined ranking criteria. The method also includes determining a selected bias signal combination among the plurality of bias signal combinations corresponding to a selected ranked measurement among the plurality of measurements.

In another aspect, a WDS is provided. The WDS includes a plurality of remote units. The plurality of remote units is configured to receive and convert a plurality of downlink digital communications signals into a plurality of downlink RF communications signals for distribution to client devices. The plurality of remote units is also configured to receive a plurality of uplink RF communications signals from the client devices and convert the plurality of uplink RF communications signals into a plurality of uplink digital communications signals. The WDS also includes a central unit. The central unit is configured to distribute the plurality of downlink digital communications signals to the plurality of remote units. The central unit is also configured to receive the plurality of uplink digital communications signals from the plurality of remote units. At least one selected remote unit among the plurality of remote units comprises a power amplifier calibration circuit. The power amplifier calibration circuit includes a power amplifier comprising a signal input, a signal output, a first bias signal input, and a second bias signal input. The power amplifier is configured to receive an input signal having a first power at the signal input. The power amplifier is also configured to receive a first bias signal at the first bias signal input. The power amplifier is also configured to receive a second bias signal at the second bias signal input. The power amplifier is also configured to amplify the input signal to generate an output signal having a second power higher than the first power at the signal output. The power amplifier is also configured to control a first power amplifier performance parameter and a second power amplifier performance parameter in the output signal based on the first bias signal and the second bias signal. The power amplifier calibration circuit also includes a control circuit. The control circuit is configured to provide a plurality of bias signal combinations to the power amplifier. Each of the plurality of bias signal combinations includes a respective first bias signal and a respective second bias signal to be provided to the first bias signal input and the second bias signal input of the power amplifier, respectively. The control circuit is also configured to receive a plurality of performance indication signals including a plurality of measurements corresponding to the plurality of bias signal combinations, respectively. Each of the plurality of measurements includes the first power amplifier performance parameter and the second power amplifier performance parameter. The control circuit is also configured to rank the plurality of measurements based on a predefined ranking criteria. The control circuit is also configured to determine a selected bias signal combination among the plurality of bias signal combinations corresponding to a selected ranked measurement among the plurality of measurements.

Additional features and advantages will be set forth in the detailed description which follows and, in part, will be readily apparent to those skilled in the art from the description or recognized by practicing the embodiments as described in the written description and claims hereof, as well as the appended drawings.

It is to be understood that both the foregoing general description and the following detailed description are merely exemplary and are intended to provide an overview or framework to understand the nature and character of the claims.

The accompanying drawings are included to provide a further understanding of the disclosure, and are incorporated in and constitute a part of this specification. The drawings illustrate one or more embodiments, and together with the description serve to explain principles and operation of the various embodiments.

BRIEF DESCRIPTION OF THE DRAWINGS

FIG. 5 is an exemplary table that a control circuit in the power amplifier calibration circuit of FIG. 3 can access to help determine a selected bias signal combination among a plurality of bias signal combinations for optimizing a third-order intermodulation (IMD3) and an ACPR of the power amplifier concurrently;

DETAILED DESCRIPTION

Embodiments of the disclosure relate to calibrating a power amplifier. For example, the calibrated power amplifier may be employed in a remote unit in a wireless distribution system (WDS) configured to distribute wireless communications signals. A remote unit in a WDS employs a power amplifier to amplify a radio frequency (RF) communications signal before distributing the RF communications signals to client devices. The power amplifier is calibrated to optimize one or more power amplifier performance parameters. In exemplary aspects disclosed herein, the power amplifier can be calibrated to optimize a third-order intermodulation (IMD3) and an adjacent channel power ratio (ACPR) by adjusting a first bias signal and a second bias signal provided to the power amplifier. In this regard, in exemplary aspects disclosed herein, a power amplifier calibration circuit is provided. The power amplifier calibration circuit is configured to provide a plurality of bias signal combinations each including a respective first bias signal and a respective second bias signal to the power amplifier. Power amplifier performance parameters for each of the bias signal combinations can be measured and provided to a control circuit in the power amplifier calibration circuit. The control circuit is configured to rank the measured power amplifier performance parameters based on predefined ranking criteria and determines a selected bias signal combination that can optimize the power amplifier performance parameters of the power amplifier. By determining the selected bias signal combination that optimizes the power amplifier performance parameters, it is possible to calibrate the power amplifier to operate at a balanced performance level, thus helping to improve RF coverage and performance of the remote unit in the WDS.

Figure 1:
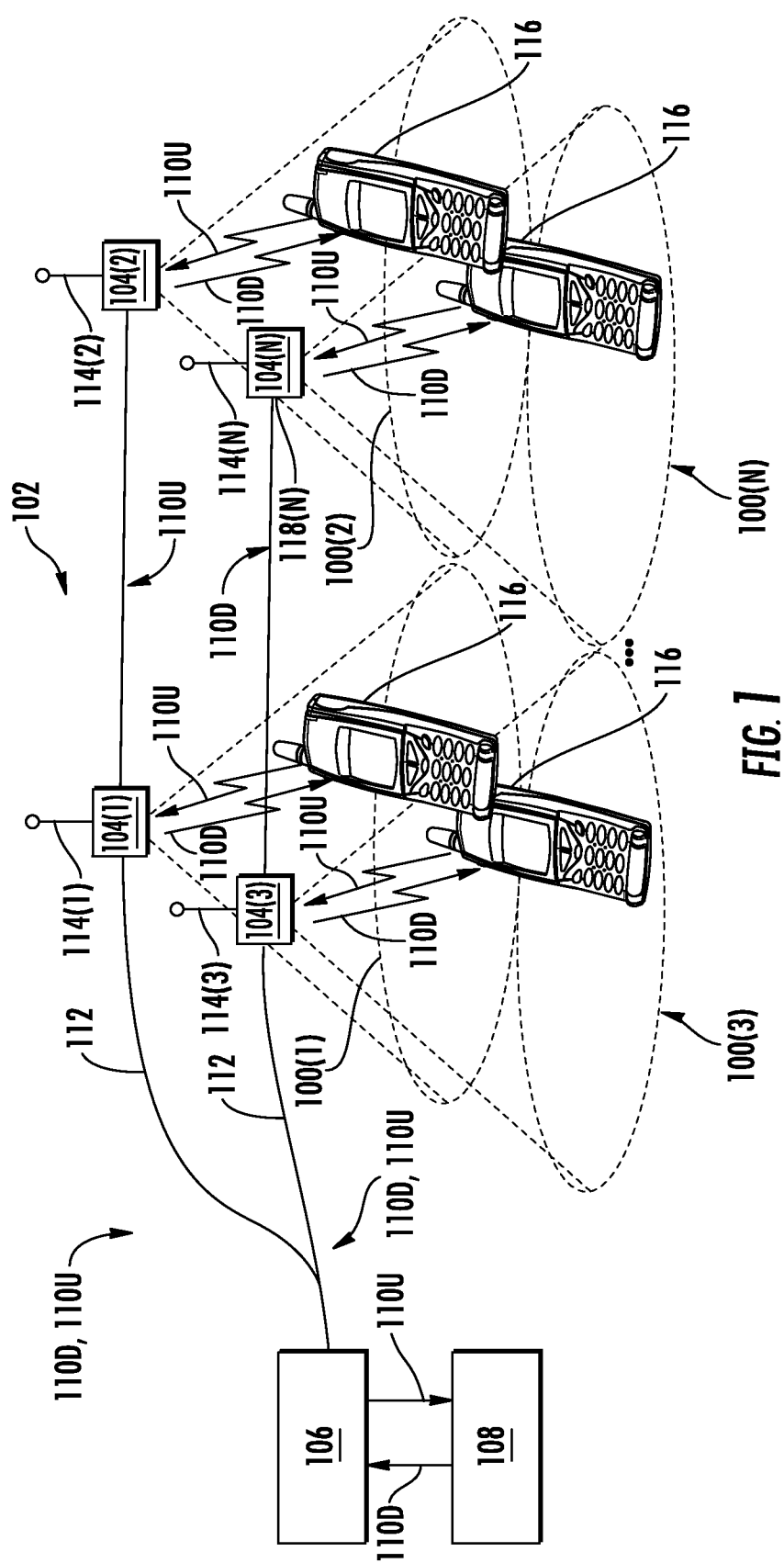
FIG. 1 is a schematic diagram of an exemplary wireless distribution system (WDS), which may be a distributed antenna system (DAS) for example.
Figure 2A:
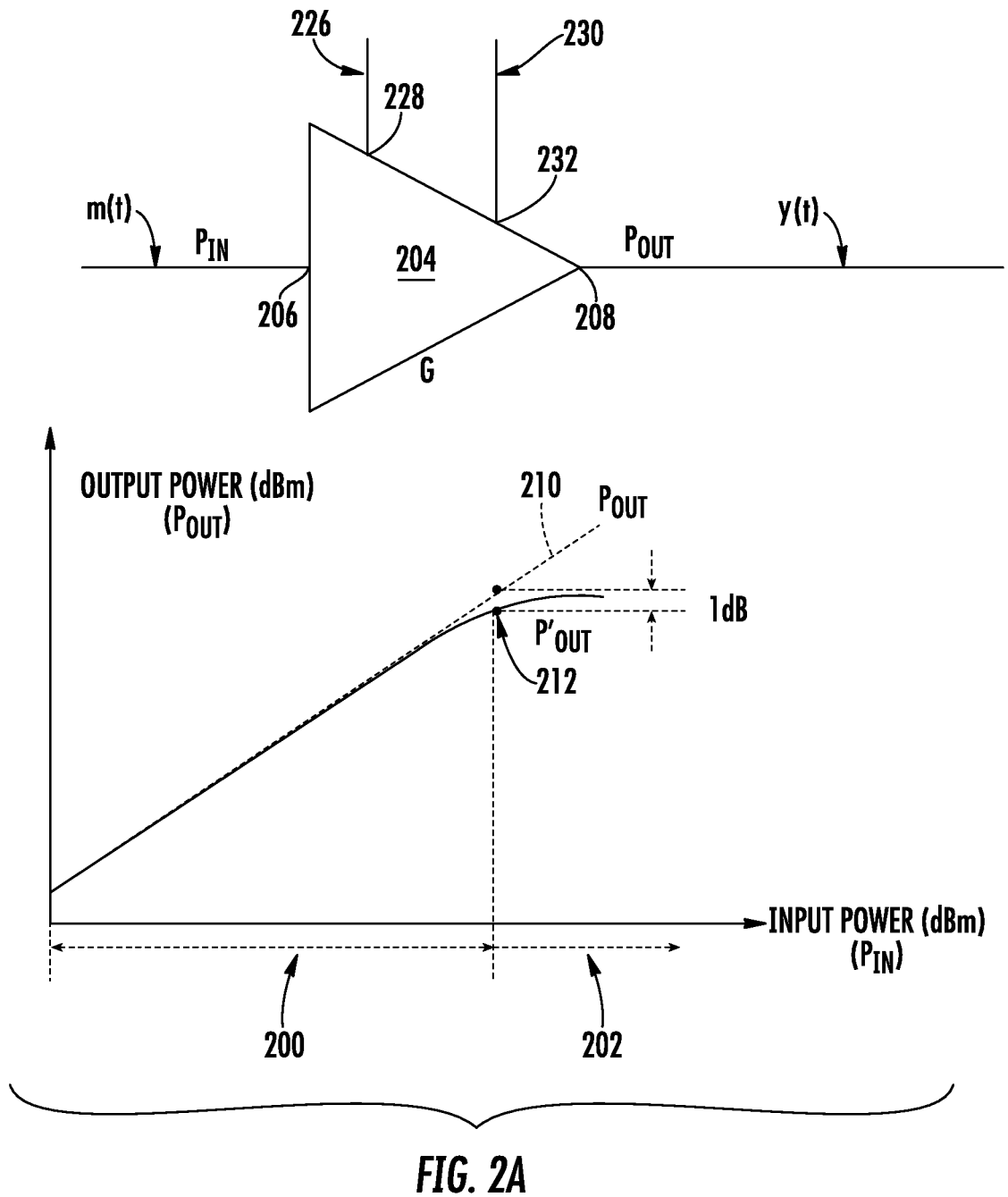
FIG. 2A is a schematic diagram providing an exemplary illustration of a linear region and a non-linear region associated with a power amplifier.
Figure 2B:
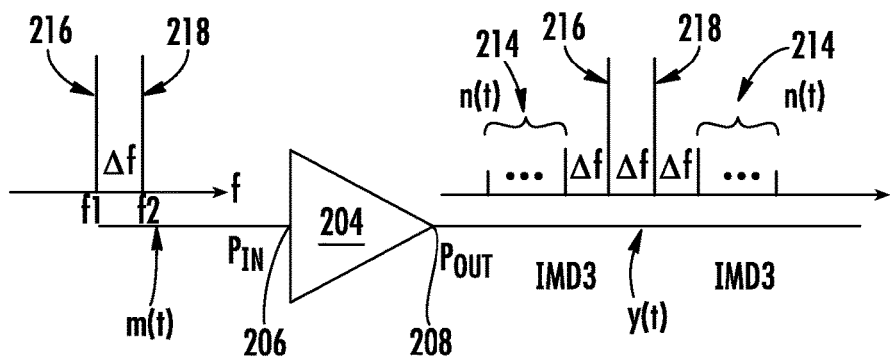
FIG. 2B is a schematic diagram providing an exemplary illustration of one or more intermodulation products that may be generated by the power amplifier of FIG. 2A in an output signal due to non-linearity of the power amplifier.
Figure 2C:
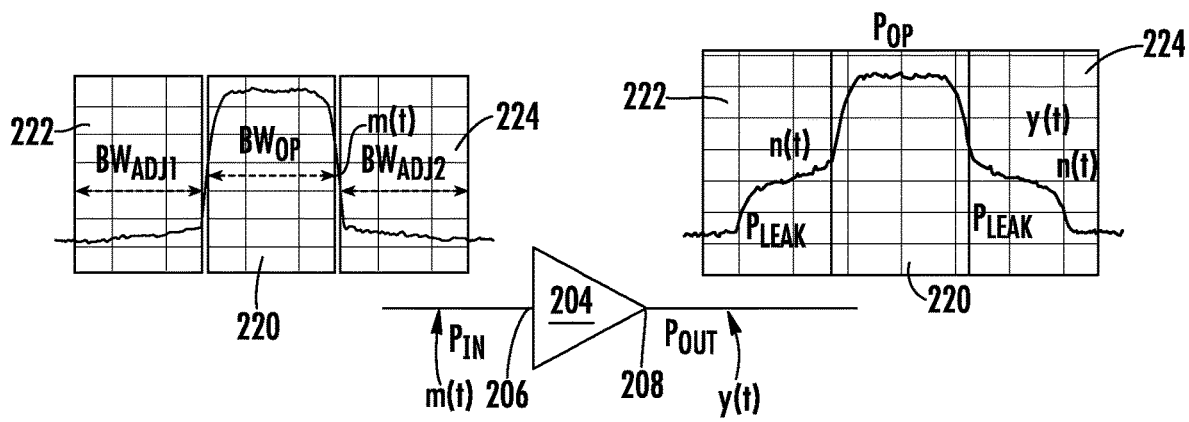
FIG. 2C is a schematic diagram providing an exemplary illustration of using an adjacent channel power ratio (ACPR) as a power amplifier performance parameter to evaluate non-linearity of the power amplifier of FIG. 2A.

Before discussing exemplary aspects of a power amplifier calibration circuit, a brief discussion on power amplifier linearity and how an IMD3 and an ACPR may be used as performance parameters to help assess power amplifier linearity is first provided with reference to FIGS. 2A-2C. The discussion of specific exemplary aspects of a power amplifier calibration circuit for calibrating a power amplifier in a remote unit in a WDS starts below with reference to FIG. 3.

In this regard, FIG. 2A is a schematic diagram providing an exemplary illustration of a linear region 200 and a non-linear region 202 associated with a power amplifier 204. The power amplifier 204 receives an input signal m(t) at an input power $P_{IN}$ via a signal input 206. The power amplifier 204 amplifies the input signal m(t) to generate an output signal y(t) at an output power $P_{OUT}$ higher than an input power $P_{IN}$, and outputs the output signal y(t) via a signal output 208.

In the linear region 200, the output signal y(t) is proportionally related to the input signal m(t) based on a power amplifier gain G of the power amplifier 204, as shown in equation Eq. 1.1 below.

$$y(t)=m(t) \times G \qquad \text{(Eq. 1.1)}$$

Accordingly, the output power $P_{OUT}$ is proportionally related to the input power $P_{IN}$ in accordance to the power amplifier gain G, as shown in equation Eq. 1.2 below.

$$P_{OUT}=P_{IN} \times G \qquad \text{(Eq. 1.2)}$$

In this regard, it is possible to express the equation Eq. 1.2 as a straight output power curve 210 in the linear region 200. The linear region 200 is separated from the non-linear region 202 at a one-decibel (1-dB) compression point 212. The 1-dB compression point 212 is defined as a point at which a non-linear output power $P'_{OUT}$ of the power amplifier 204 is 1 dB below the output power $P_{OUT}$ extrapolated from the straight output power curve 210. The extent to which the output power Pour of the power amplifier 204 must be set below the 1-dB compression point 212 to meet a linearity requirement of the power amplifier 204 is commonly referred to as a power back-off.

In certain application scenarios, the power amplifier 204 may need to operate in the non-linear region 202 to boost the output power $P_{OUT}$ to a higher power level (e.g., more than 33 dBm). In the non-linear region 202, the output signal y(t) is no longer proportionally related to the input signal m(t) as shown in the equation Eq. 1.1 above. Instead, the relationship between the output signal y(t) and the input signal m(t) is determined by equation Eq. 2 below.

$$y(t)=m(t) \times G+n(t) \qquad \text{(Eq. 2)}$$

In the equation Eq. 2, n(t) represents one or more non-linear products that are added to the output signal y(t) as a result of non-linear characteristics of the power amplifier 204 in the non-linear region 202. Among many power amplifier-related performance metrics, the IMD3 and the ACPR are two commonly used power amplifier performance parameters for expressing and measuring the non-linear performance of the power amplifier 204. The IMD3 and the ACPR are discussed next with reference to FIGS. 2B and 2C, respectively.

In this regard, FIG. 2B is a schematic diagram providing an exemplary illustration of one or more intermodulation products 214 that may be generated by the power amplifier 204 of FIG. 2A in the output signal y(t) due to non-linearity of the power amplifier 204. Common elements between FIGS. 2A and 2B are shown therein with common element numbers and will not be re-described herein.

The power amplifier 204 receives the input signal m(t) as a modulated signal that includes a first signal 216 at a first frequency $f_1$ and a second signal 218 at a second frequency $f_2$ ($f_2 > f_1$). The first frequency $f_1$ is separated from the second frequency $f_2$ by a frequency space $\Delta f$. The output signal y(t) includes the first signal 216 at the first frequency $f_1$ and the second signal 218 at the second frequency $f_2$. However, due to the non-linearity of the power amplifier 204, the output signal y(t) also includes the non-linear product(s) n(t) as show in the equation Eq. 2 above. One form of the non-linear product(s) n(t) would be the intermodulation products 214 that appear in frequency spectrums lower than the first frequency $f_1$ and higher than the second frequency $f_2$. More specifically, the intermodulation products 214 would appear at frequencies $f_1 - n\,\Delta f$ ($n \geq 1$) and $f_2 + n\,\Delta f$ ($n \geq 1$). For example, if the first frequency $f_1$ and the second frequency $f_2$ are at 1930 megahertz (MHz) and 1950 MHz, respectively, the intermodulation products 214 would appear at frequencies 1910 MHz, 1890 MHz, 1870 MHz, 1850 MHz, and so on. The intermodulation products 214 would also appear at frequencies 1970 MHz, 1990 MHz, 2010 MHz, 2030 MHz, and so on.

Among the intermodulation products 214, the intermodulation products appearing at frequencies $f_1 - \Delta f$ (e.g., 1910 MHz) and $f_2 + \Delta f$ (e.g., 1970 MHz) are commonly referred to as the IMD3. Notably, it can be difficult to completely remove the IMD3 from the output signal y(t) based on signal filtering. When the frequency space $\Delta f$ is much smaller than the first frequency $f_1$ and the second frequency $f_2$ ($\Delta f \ll f_1, f_2$), the IMD3 can fall close to the first frequency $f_1$ and the second frequency $f_2$. As a result, the IMD3 can potentially interfere with the first signal 216 and the second signal 218, thus compromising performance and efficiency of the power amplifier 204.

FIG. 2C is a schematic diagram providing an exemplary illustration of using the ACPR as a power amplifier performance parameter to evaluate the non-linearity of the power amplifier 204 of FIG. 2A. Common elements between FIGS. 2A and 2C are shown therein with common element numbers and will not be re-described herein.

The input signal m(t) is a broadband signal that occupies an operation channel 220 having an operation bandwidth $BW_{OP}$. The operation channel 220 is adjacent to a first adjacent channel 222 and a second adjacent channel 224. The first adjacent channel 222 has a first adjacent bandwidth $BW_{ADJ1}$ and the second adjacent channel 224 has a second adjacent bandwidth $BW_{ADJ2}$. If the power amplifier 204 is linear, the output power $P_{OUT}$ in the output signal y(t) will be concentrated in the operation bandwidth $BW_{OP}$ of the operation channel 220. However, due to non-linearity of the power amplifier 204, the output signal y(t) may experience a spectrum regrowth. As a result, a portion of the output power $P_{OUT}$ may be leaked from the operation channel 220 into the first adjacent channel 222 and the second adjacent channel 224.

The ACPR is defined as a ratio between a total power leaked into the first adjacent channel 222 and the second adjacent channel 224 ($P_{LEAK}$) and a total power in the operation channel 220 ($P_{OP}$), as shown in equation Eq. 3 below.

$$\mathrm{ACPR} = P_{LEAK} \div P_{OP} \quad \text{(Eq. 3)}$$

In this regard, the higher the ACPR, the more severe the spectrum regrowth is in the output signal y(t). Such spectrum regrowth may interfere with the first adjacent channel 222 and the second adjacent channel 224, thus compromising performance and efficiency of the power amplifier 204.

With reference back to FIG. 2A, it may be possible to improve linearity, suppress the IMD3, and/or reduce the ACPR of the power amplifier 204 by providing a first bias signal 226 to a first bias signal input 228 and a second bias signal 230 to a second bias signal input 232 of the power amplifier 204. The first bias signal 226 and the second bias signal 230 may be provided as respective digital words. The first bias signal 226 and the second bias signal 230 may control internal digital potentiometers and voltage dividers to apply voltages to drive two transistor bias ports (e.g., voltages provided to a source electrode and to a gate electrode). The first bias signal 226 and the second bias signal 230 can be tuned concurrently to adjust the linearity, the IMD3, and/or the ACPR of the power amplifier 204.

However, the first bias signal 226 and the second bias signal 230 are often not correlated during power amplifier calibration. Consequently, it may be difficult to calibrate the power amplifier 204 to improve the linearity, suppress the IMD3, and reduce the ACPR concurrently. Hence, it may be desired to determine an optimal combination of the first bias signal 226 and the second bias signal 230 that can enable the power amplifier 204 to operate with increased linearity, suppress the IMD3, and reduce the ACPR concurrently.

Figure 3:
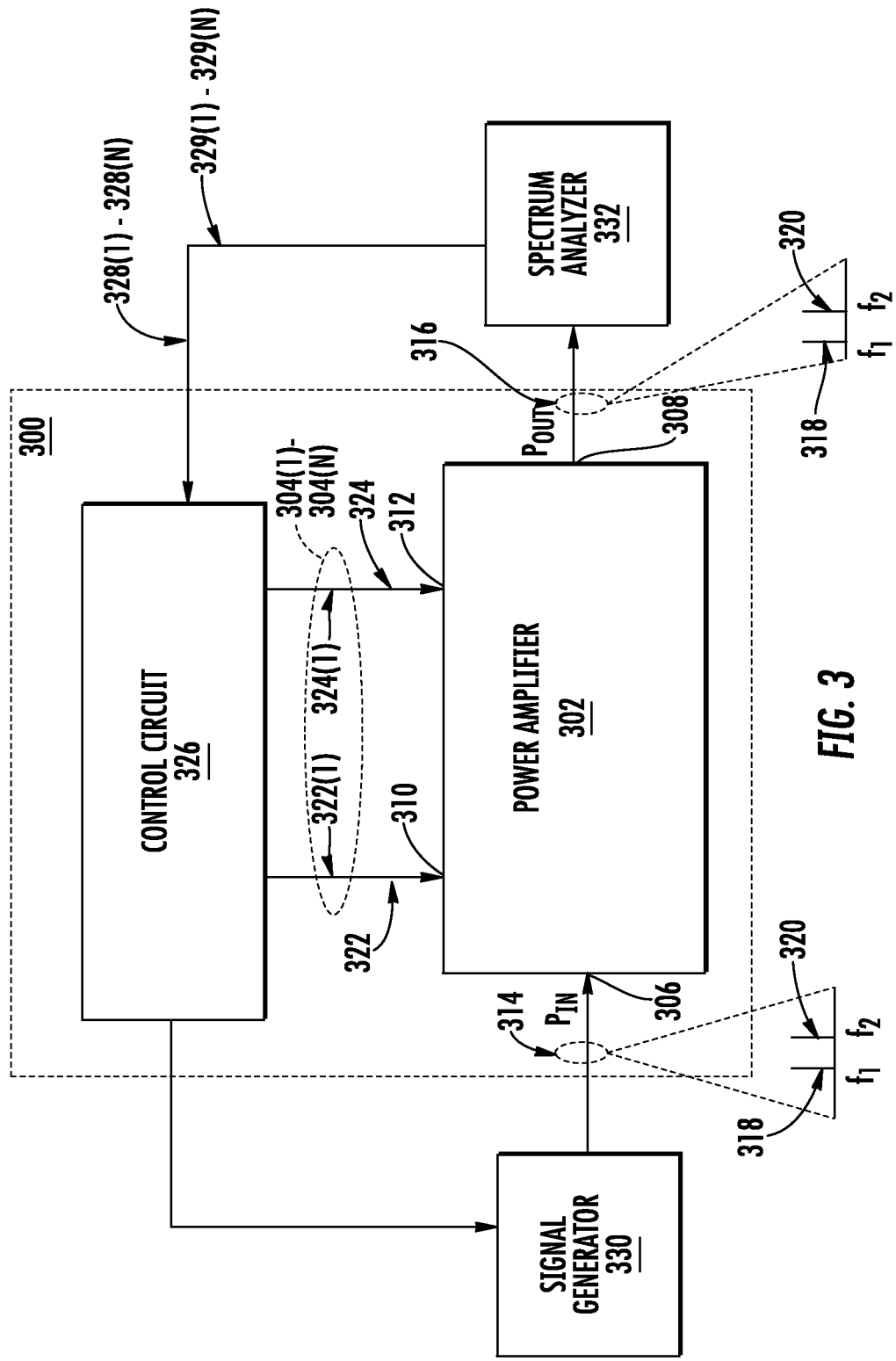
FIG. 3 is a schematic diagram of an exemplary power amplifier calibration circuit configured to calibrate a power amplifier to optimize a first power amplifier performance parameter and a second power amplifier performance parameter of the power amplifier.

In this regard, FIG. 3 is a schematic diagram of an exemplary power amplifier calibration circuit 300 configured to calibrate a power amplifier 302 to optimize a first power amplifier performance parameter and a second power amplifier performance parameter of the power amplifier 302. In a non-limiting example, the power amplifier calibration circuit 300 can be configured to calibrate the power amplifier 302 to optimize the first power amplifier performance parameter and the second power amplifier performance parameter of the power amplifier 302 concurrently. As is discussed in detail below, the power amplifier calibration circuit 300 is configured to provide a plurality of bias signal combinations 304(1)-304(N) to the power amplifier 302 and measure one or more power amplifier performance parameters (e.g., IMD3 and ACPR) of the power amplifier 302 affected by each of the bias signal combinations 304(1)-304(N). Thus, by ranking the power amplifier performance parameters in relation with each of the bias signal combinations 304(1)-304(N), the power amplifier calibration circuit 300 may determine a best-possible bias signal combination among the bias signal combinations 304(1)-304(N) that can best optimize the first power amplifier performance parameter and the second power amplifier parameter of the power amplifier 302 concurrently. As a result, it may be possible to calibrate the power amplifier 302 to perform at a balanced performance level, thus helping to improve efficiency and performance of the power amplifier 302.

With continuing reference to FIG. 3, the power amplifier includes a signal input 306, a signal output 308, a first bias signal input 310, and a second bias signal input 312. The power amplifier 302 is configured to receive an input signal 314 having a first power $P_{IN}$ at the signal input 306. The power amplifier 302 is also configured to amplify the input signal 314 to generate an output signal 316 having a second power $P_{OUT}$ higher than the first power $P_{IN}$ ($P_{OUT}>P_{IN}$) at the signal output 308. In a non-limiting example, the input signal 314 can be a modulated broadband input signal that includes a first signal 318 at a first signal frequency $f_1$ and a second signal 320 at a second signal frequency $f_2$ ($f_2>f_1$). Accordingly, the power amplifier 302 generates a modulated broadband output signal including the first signal 318 at the first signal frequency $f_1$ and the second signal 320 at the second signal frequency $f_2$. According to previous discussions with reference to FIGS. 2B and 2C, the output signal 316 may include the non-linear product(s) n(t), as shown in the equation Eq. 2, due to intermodulation and spectrum regrowth. As such, it may be necessary to calibrate the power amplifier 302 to suppress the IMD3 and reduce the ACPR. In this regard, the power amplifier 302 is configured to receive a first bias signal 322 at the first bias signal input 310 and receive a second bias signal 324 at the second bias signal input 312. In a non-limiting example, the first bias signal 322 and the second bias signal 324 can be provided to the power amplifier 302 as a first digital word and a second digital word, respectively. The power amplifier 302 is further configured to control concurrently the first power amplifier performance parameter (e.g., the IMD3) and the second power amplifier performance parameter (e.g., the ACPR) in the output signal 316 based on the first bias signal 322 and the second bias signal 324.

As previously discussed with reference to FIG. 2A, the first bias signal 226 and the second bias signal 230 of FIG. 2A are often not correlated during power amplifier calibration. As a result, it would be difficult to optimize linearity, IMD3, and ACPR for the power amplifier 204 in FIG. 2A concurrently. Thus, to help optimize the first power amplifier performance parameter and the second power amplifier performance parameter concurrently for the power amplifier 302, it may be necessary to control the first power amplifier performance parameter and the second power amplifier performance parameter based on various combinations of the first bias signal 322 and the second bias signal 324. By doing so, it may be possible to determine an optimal combination of the first bias signal 322 and the second bias signal 324 that can optimize the first power amplifier performance parameter and the second power amplifier performance parameter concurrently.

In this regard, the power amplifier calibration circuit 300 further includes a control circuit 326, which can be a microprocessor, a microcontroller, or a field-programmable gate array (FPGA) for example. The control circuit 326 may be integrated with the power amplifier 302 or independent from the power amplifier 302. The control circuit 326 is configured to provide the bias signal combinations 304(1)-304(N) to the power amplifier 302. Each of the bias signal combinations 304(1)-304(N) includes a respective first bias signal 322(1) and a respective second bias signal 324(1) to be provided to the first bias signal input 310 and the second bias signal input 312, respectively. Notably, the respective first bias signal 322(1) and the respective second bias signal 324(1) are functionally equivalent to the first bias signal 322 and the second bias signal 324, respectively. It should be appreciated that the respective first bias signal 322(1) and the respective second bias signal 324(1) in each of the bias signal combinations 304(1)-304(N) may be the same or different. Further, the respective first bias signal 322(1) in each of the bias signal combinations 304(1)-304(N) may be the same or different, and the respective second bias signal 324(1) in each of the bias signal combinations 304(1)-304(N) may be the same or different as well. As such, by providing the bias signal combinations 304(1)-304(N) to the power amplifier 302, the power amplifier 302 may control the first power amplifier performance parameter and the second power amplifier performance parameter based on the various combinations of the first bias signal 322 and the second bias signal 324.

With continuing reference to FIG. 3, the control circuit 326 is configured to receive a plurality of performance indication signals 328(1)-328(N) corresponding to the bias signal combinations 304(1)-304(N), respectively. The performance indication signals 328(1)-328(N) include a plurality of measurements 329(1)-329(N) corresponding to the bias signal combinations 304(1)-304(N), respectively. Each of the measurements 329(1)-329(N) includes a measurement of the first power amplifier performance parameter and a measurement of the second power amplifier performance parameter. In this regard, each of the bias signal combinations 304(1)-304(N) corresponds to a respective measurement of the first power amplifier performance parameter and the second power amplifier performance parameter.

The control circuit 326 ranks the measurements 329(1)-329(N) based on a predefined ranking criteria, which will be further discussed later with reference to FIG. 5. Accordingly, the control circuit 326 can determine a selected bias signal combination among the bias signal combinations 304(1)-304(N) corresponding to a selected ranked measurement among the measurements 329(1)-329(N). Subsequently, the control circuit 326 may control the power amplifier 302 to operate based on the selected bias signal combination. By configuring the power amplifier 302 to operate based on the selected bias signal combination, it may be possible to optimize the first power amplifier performance parameter and the second power amplifier performance parameter concurrently, thus helping to improve the linearity and performance of the power amplifier 302.

The control circuit 326 may be configured to calibrate the power amplifier 302 according to a process. In this regard, FIG. 4 is a flowchart of an exemplary process 400 that may be employed by the control circuit 326 in the power amplifier calibration circuit 300 of FIG. 3 for calibrating the power amplifier 302 to optimize the first power amplifier performance parameter and the second power amplifier performance parameter concurrently.

Figure 4:
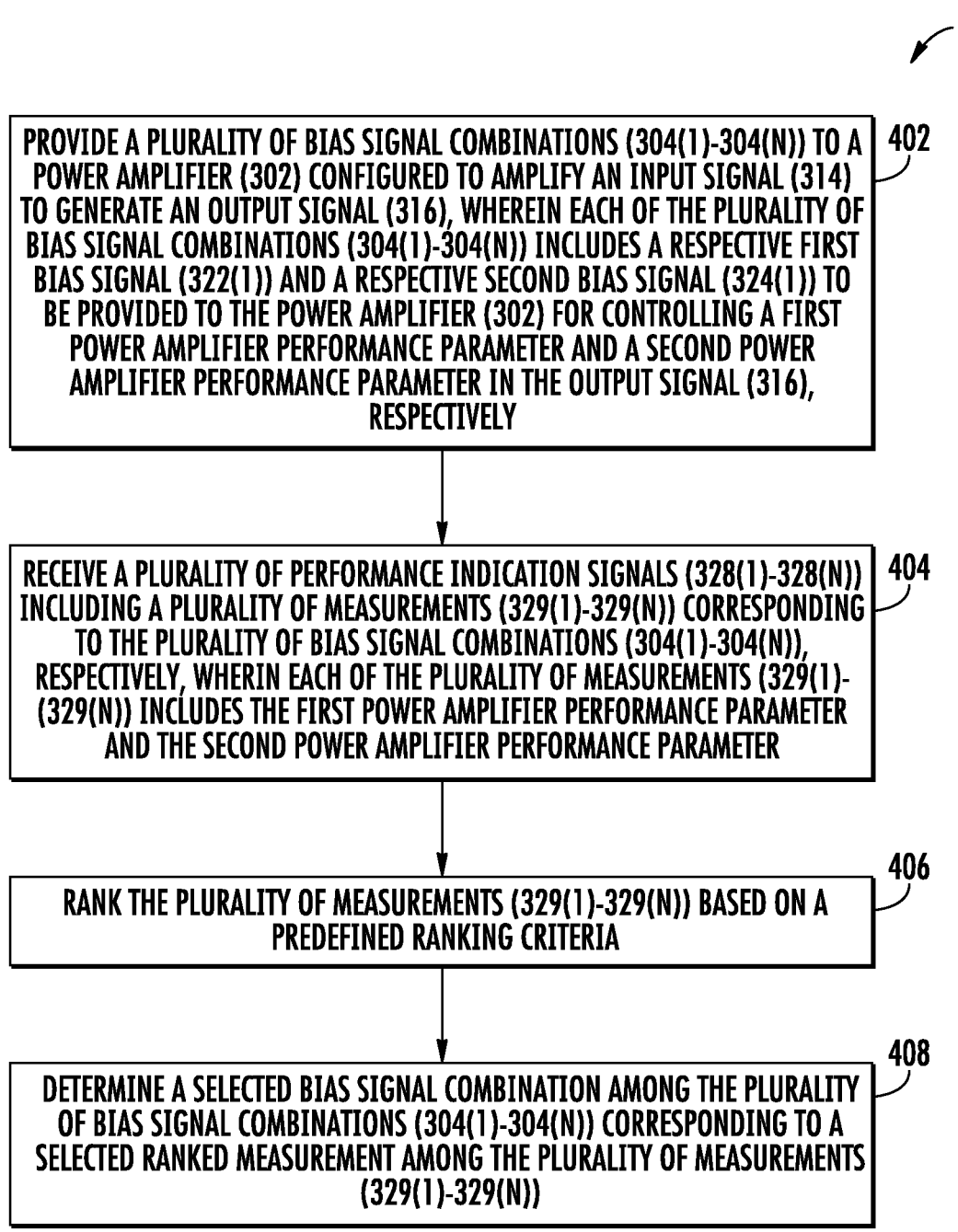
FIG. 4 is a flowchart of an exemplary process that may be employed by a control circuit in the power amplifier calibration circuit of FIG. 3 for calibrating the power amplifier to optimize the first power amplifier performance parameter and the second power amplifier performance parameter concurrently.

With reference to FIG. 4, the control circuit 326 provides the bias signal combinations 304(1)-304(N) to the power amplifier 302 that is configured to amplify the input signal 314 to generate the output signal 316 (block 402). Each of the bias signal combinations 304(1)-304(N) includes the respective first bias signal 322(1) and the respective second bias signal 324(1) to be provided to the power amplifier 302 for concurrently controlling the first power amplifier performance parameter and the second power amplifier performance parameter in the output signal 316, respectively. The control circuit 326 receives the performance indication signals 328(1)-328(N) including the measurements 329(1)-329(N) corresponding to the bias signal combinations 304(1)-304(N), respectively (block 404). Each of the measurements 329(1)-329(N) includes the first power amplifier performance parameter and the second power amplifier performance parameter. The control circuit 326 ranks the measurements 329(1)-329(N) based on the predefined ranking criteria (block 406). The control circuit 326 determines the selected bias signal combination among the bias signal combinations 304(1)-304(N) corresponding to the selected ranked measurement among the measurements 329(1)-329 (N) (block 408).

With reference back to FIG. 3, the power amplifier 302 may be communicatively coupled to a signal generator 330 and a spectrum analyzer 332. In this regard, the power amplifier 302 receives the input signal 314 from the signal generator 330 and provides the output signal 316 to the spectrum analyzer 332. The signal generator 330 may be configured to generate the input signal 314 including the first signal 318 at the first signal frequency $f_1$ of 1962 MHZ and the second signal 320 at the second signal frequency $f_2$ of 1963 MHz for calibrating the IMD3. The signal generator 330 may be configured to generate the input signal 314 as a wideband code-division multiple-access (WCDMA) signal that includes one of the first signal 318 and the second signal 320 for calibrating the ACPR.

The spectrum analyzer 332 may be configured to generate the measurements 329(1)-329(N) based on the output signal 316. The spectrum analyzer 332 may be further configured to generate the performance indication signals 328(1)-328(N) that include the measurements 329(1)-329(N) in association with the bias signal combinations 304(1)-304(N), respectively. The spectrum analyzer 332 may be communicatively coupled to the control circuit 326 to provide the performance indication signals 328(1)-328(N) to the control circuit 326.

In a non-limiting example, the first power amplifier performance parameter may correspond to the IMD3 in the output signal 316 and the second power amplifier performance parameter may correspond to the ACPR in the output signal 316. In this regard, the power amplifier 302 is configured to control the IMD3 and the ACPR in the output signal 316 based on the first bias signal 322 and the second bias signal 324, respectively.

As previously discussed, the control circuit 326 receives the measurements 329(1)-329(N) in association with the bias signal combinations 304(1)-304(N), respectively. In this regard, each of the measurements 329(1)-329(N) includes a respective IMD3 and a respective ACPR of the output signal 316. Since the measurements 329(1)-329(N) are associated with the bias signal combinations 304(1)-304(N), respectively, the control circuit 326 can examine the respective IMD3 and the respective ACPR associated with each of the bias signal combinations 304(1)-304(N) to determine the selected bias signal combination among the bias signal combinations 304(1)-304(N) that can optimize the IMD3 and the ACPR concurrently.

In a non-limiting example, the control circuit 326 can utilize a table, which can be created in a storage medium (e.g., memory), to help determine the selected bias signal combination among the bias signal combinations 304(1)-304(N). In this regard, FIG. 5 is an exemplary table 500 that the control circuit 326 in the power amplifier calibration circuit 300 of FIG. 3 can access to help determine the selected bias signal combination among the bias signal combinations 304(1)-304(N) for optimizing the IMD3 and the ACPR of the power amplifier 302 concurrently. Common elements between FIGS. 3 and 5 are shown therein with common element numbers and will not be re-described herein.

With reference to FIG. 5, the table 500 includes a second bias word column 502, a first bias word column 504, a measured IMD3 column 506, a measured ACPR column 508, an IMD3 margin column 510, an ACPR margin column 512, a scaled IMD3 margin column 514, a scaled ACPR margin column 516, and a minimal margin column 518. As previously discussed with reference to FIG. 3, the first bias signal 322 and the second bias signal 324 may be represented by the first digital word and the second digital word, respectively. Accordingly, the second bias word column 502 is configured to store the second digital word representing the second bias signal 324, and the first bias word column 504 is configured to store the first digital word representing the first bias signal 322. The table 500 includes a plurality of rows 520(1)-520(N) that corresponds to the measurements 329(1)-329(N) in association with the bias signal combinations 304(1)-304(N), respectively.

For each measurement among the measurements 329(1)-329(N), the control circuit 326 stores a respective second digital word and a respective first digital word, which are associated with the measurement, in the second bias word column 502 and the first bias word column 504, respectively. The control circuit 326 stores the respective IMD3 and the respective ACPR received in the measurement in the measured IMD3 column 506 and the measured ACPR column 508, respectively. The control circuit 326 calculates a respective IMD3 margin between a predefined IMD3 threshold and the respective IMD3 stored in the measured IMD3 column 506, and stores the respective IMD3 margin in the IMD3 margin column 510. Likewise, the control circuit 326 calculates a respective ACPR margin between a predefined ACPR threshold and the respective ACPR stored in the measured ACPR column 508, and stores the respective ACPR margin in the ACPR margin column 512.

The control circuit 326 may scale the respective IMD3 margin and/or the respective ACPR margin based on a predefined IMD3 scale factor and a predefined ACPR scale factor, respectively. The predefined IMD3 scale factor and the predefined ACPR scale factor may be used as weighting factors for the respective IMD3 margin and the respective ACPR margin. In this regard, when the predefined IMD3 scale factor equals the predefined ACPR scale factor, the respective IMD3 margin and the respective ACPR margin are said to have equal weights. The control circuit 326 multiples the predefined IMD3 scale factor with the respective IMD3 margin to generate a respective scaled IMD3 margin, and stores the respective IMD3 margin in the scaled IMD3 margin column 514. Likewise, the control circuit 326 multiples the predefined ACPR scale factor with the respective ACPR margin to generate a respective scaled ACPR margin, and stores the respective ACPR margin in the scaled ACPR margin column 516. The control circuit 326 then determines a respective minimum margin, which corresponds to a smaller scaled margin between the respective scaled IMD3 margin stored in the scaled IMD3 margin column 514 and the respective scaled ACPR margin stored in the scaled ACPR margin column 516. The control circuit 326 stores the respective minimal margin in the minimal margin column 518.

For example, the control circuit 326 appends row 520(1) to the table 500 in response to receiving measurement 329(1) in association with bias signal combination 304(1). The bias signal combination 304(1) includes the first bias signal 322 and the second bias signal 324 represented by the first digital word "169" and the second digital word "126," respectively. Accordingly, the control circuit 326 stores the second digital word "126" and the first digital word "169" in the second bias word column 502 and the first bias word column 504, respectively.

The measurement 329(1) includes the respective IMD3 that equals −13.6 dB and the respective ACPR that equals −48.2 dB. The control circuit 326 stores the respective IMD3 and the respective ACPR in the measured IMD3 column 506 and the measured ACPR column 508 of the row 520(1), respectively.

In a non-limiting example, the predefined IMD3 threshold is −18 dBm and the predefined ACPR threshold is −50 dBm. Accordingly, the control circuit 326 may calculate the respective IMD3 margin as being −4.4 dB [−18 dBm−(−13.6 dBm)], and stores the respective IMD3 margin in the IMD3 margin column 510 of the row 520(1). Likewise, the control circuit 326 may calculate the respective ACPR margin as being −1.8 dB [−50 dB−(−48.2 dBm)], and stores the respective ACPR margin in the ACPR margin column 512 of the row 520(1).

Next, the control circuit 326 scales the IMD3 margin and the ACPR margin based on the predefined IMD3 scale factor and the predefined ACPR scale factor, respectively. In the examples provided herein, the predefined IMD3 scale factor and the predefined ACPR scale factor both equal one (1). Accordingly, the respective scaled IMD3 margin in the scaled IMD3 margin column 514 equals the respective IMD3 margin in the IMD3 margin column 510. Likewise, the respective scaled ACPR margin in the scaled ACPR margin column 516 equals the respective ACPR margin in the ACPR margin column 512.

Subsequently, the control circuit 326 selects the smaller scaled margin between the respective scaled IMD3 margin stored in the scaled IMD3 margin column 514 and the respective scaled ACPR margin stored in the scaled ACPR margin column 516. In this example, the respective scaled IMD3 margin in the scaled IMD3 margin column 514 is selected as the minimal margin and stored in the minimal margin column 518 of the row 520(1) because the respective scaled IMD3 margin (−4.4 dB) is smaller than the respective scaled ACPR margin (−1.8 dB). Accordingly, the control circuit 326 may append rows 520(2)-520(N) to the table 500 for storing processing results of measurements 329(2)-329(N) in association with bias signal combinations 304(2)-304(N), respectively.

Upon completing the processing of the measurements 329(1)-329(N) in association with the bias signal combinations 304(1)-304(N), the control circuit 326 may rank the bias signal combinations 304(1)-304(N) based on the respective minimal margin associated with each of the bias signal combinations 304(1)-304(N) in the table 500. Accordingly, the control circuit 326 may determine the selected bias signal combination as being a bias signal combination among the bias signal combinations 304(1)-304(N) corresponding to a highest respective minimal margin in the table 500. In the examples shown in FIG. 5, the respective minimal margin in row 520(19) (1.9 dB) is the highest respective minimal margin in the table 500. Accordingly, bias signal combination 304(19), which includes the first digital word as "173" and the second digital word as "130," would be determined to be the selected bias signal combination that can optimize the IMD3 and the ACPR of the power amplifier 302 concurrently.

The power amplifier calibration circuit 300 of FIG. 3 can be utilized to calibrate the power amplifier 302 when the power amplifier 302 is manufactured, assembled, and/or fabricated prior to being deployed in a remote unit in a WDS. Alternatively, it may be possible to calibrate the power amplifier 302 using the power amplifier calibration circuit 300 after the power amplifier 302 is displayed in the remote unit in the WDS. In this regard, the power amplifier calibration circuit 300 may be integrated into the remote unit. Accordingly, the control circuit 326 in the power amplifier calibration circuit 300 may be the same control circuit that controls operation of the remote unit. To perform power amplifier calibration using the power amplifier calibration circuit 300, the remote unit having the power amplifier 302 may be put into a test mode by being disconnected from a live signal source and/or an antenna, and reconnected to the live signal source and/or the antenna when the power amplifier calibration is completed.

Figure 6:
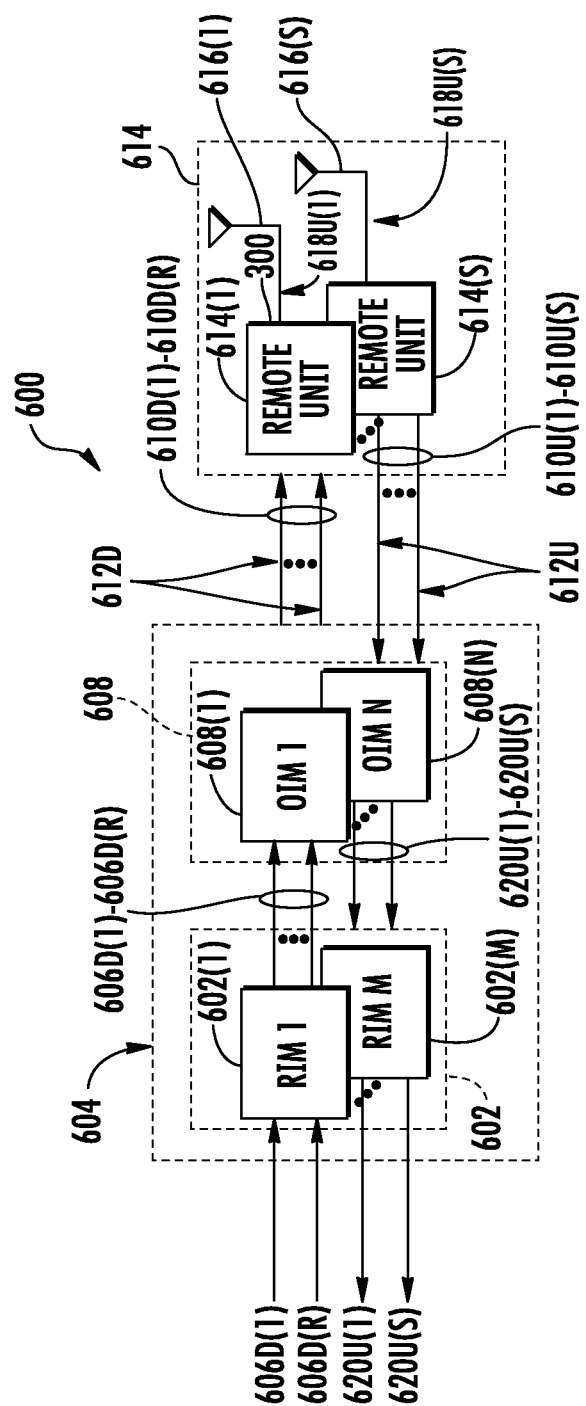
FIG. 6 is a schematic diagram of an exemplary WDS provided in the form of an optical fiber-based WDS that can include a plurality of remote units that may employ the power amplifier calibration circuit of FIG. 3 to help optimize the first power amplifier performance parameter and the second power amplifier performance parameter concurrently.

FIG. 6 is a schematic diagram of an exemplary WDS 600 provided in the form of an optical fiber-based WDS that can include a plurality of remote units that may employ the power amplifier calibration circuit 300 of FIG. 3 to help optimize the first power amplifier performance parameter and the second power amplifier performance parameter concurrently. The WDS 600 includes an optical fiber for distributing communications services for multiple frequency bands. The WDS 600 in this example is comprised of three (3) main components. A plurality of radio interfaces provided in the form of radio interface modules (RIMs) 602(1)-602(M) are provided in a central unit 604 to receive and process a plurality of downlink digital communications signals 606D(1)-606D(R) prior to optical conversion into downlink optical fiber-based communications signals. The downlink digital communications signals 606D(1)-606D(R) may be received from a base station as an example. The RIMs 602(1)-602(M) provide both downlink and uplink interfaces for signal processing. The notations "1-R" and "1-M" indicate that any number of the referenced component, 1-R and 1-M, respectively, may be provided. The central unit 604 is configured to accept the RIMs 602(1)-602(M) as modular components that can easily be installed and removed or replaced in the central unit 604. In one example, the central unit 604 is configured to support up to twelve (12) RIMs 602(1)-602(12). Each of the RIMs 602(1)-602(M) can be designed to support a particular type of radio source or range of radio sources (i.e., frequencies) to provide flexibility in configuring the central unit 604 and the WDS 600 to support the desired radio sources.

For example, one RIM 602 may be configured to support the Personalized Communications System (PCS) radio band. Another RIM 602 may be configured to support the 800 megahertz (MHz) radio band. In this example, by inclusion of the RIMs 602(1)-602(M), the central unit 604 could be configured to support and distribute communications signals on both PCS and Long-Term Evolution (LTE) 700 radio bands, as an example. The RIMs 602(1)-602(M) may be provided in the central unit 604 that support any frequency bands desired, including, but not limited to, the US Cellular band, PCS band, Advanced Wireless Service (AWS) band, 700 MHz band, Global System for Mobile communications (GSM) 900, GSM 1800, and Universal Mobile Telecommunications System (UMTS). The RIMs 602(1)-602(M) may also be provided in the central unit 604 that support any wireless technologies desired, including, but not limited to, Code Division Multiple Access (CDMA), CDMA200, 1×RTT, Evolution-Data Only (EV-DO), UMTS, High-speed Packet Access (HSPA), GSM, General Packet Radio Services (GPRS), Enhanced Data GSM Environment (EDGE), Time Division Multiple Access (TDMA), LTE, iDEN, and Cellular Digital Packet Data (CDPD).

The RIMs 602(1)-602(M) may be provided in the central unit 604 that support any frequencies desired, including, but not limited to, US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TTE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

With continuing reference to FIG. 6, the downlink digital communications signals 606D(1)-606D(R) are provided to a plurality of optical interfaces provided in the form of optical interface modules (OIMs) 608(1)-608(N) in this embodiment to convert the downlink digital communications signals 606D(1)-606D(R) into a plurality of downlink optical fiber-based communications signals 610D(1)-610D(R). The notation "1-N" indicates that any number of the referenced component 1-N may be provided. The OIMs 608(1)-608(N) may be configured to provide a plurality of optical interface components (OICs) that contain optical-to-electrical (O/E) and electrical-to-optical (E/O) converters, as will be described in more detail below. The OIMs 608(1)-608(N) support the radio bands that can be provided by the RIMs 602(1)-602(M), including the examples previously described above.

The OIMs 608(1)-608(N) each include E/O converters to convert the downlink digital communications signals 606D(1)-606D(R) into the downlink optical fiber-based communications signals 610D(1)-610D(R). The downlink optical fiber-based communications signals 610D(1)-610D(R) are communicated over a downlink optical fiber-based communications medium 612D to a plurality of remote units 614(1)-614(S). At least one selected remote unit among the remote units 614(1)-614(S), for example, remote unit 614(1), is configured to employ the power amplifier calibration circuit 300 of FIG. 3 to help optimize the first power amplifier performance parameter and the second power amplifier performance parameter concurrently. The notation "1-S" indicates that any number of the referenced component 1-S may be provided. Remote unit O/E converters provided in the remote units 614(1)-614(S) convert the downlink optical fiber-based communications signals 610D(1)-610D(R) back into the downlink digital communications signals 606D(1)-606D(R), which are the converted into a plurality of downlink RF communications signals and provided to antennas 616(1)-616(S) in the remote units 614(1)-614(S) to client devices in the reception range of the antennas 616(1)-616(S).

The remote units 614(1)-614(S) receive a plurality of uplink RF communications signals from the client devices through the antennas 616(1)-616(S). The remote units 614(1)-614(S) convert the uplink RF communications signals into a plurality of uplink digital communications signals 618U(1)-618U(S). Remote unit E/O converters are also provided in the remote units 614(1)-614(S) to convert the uplink digital communications signals 618U(1)-618U(S) into a plurality of uplink optical fiber-based communications signals 610U(1)-610U(S). The remote units 614(1)-614(S) communicate the uplink optical fiber-based communications signals 610U(1)-610U(S) over an uplink optical fiber-based communications medium 612U to the OIMs 608(1)-608(N) in the central unit 604. The OIMs 608(1)-608(N) include O/E converters that convert the received uplink optical fiber-based communications signals 610U(1)-610U(S) into a plurality of uplink digital communications signals 620U(1)-620U(S), which are processed by the RIMs 602(1)-602(M) and provided as the uplink digital communications signals 620U(1)-620U(S). The central unit 604 may provide the uplink digital communications signals 620U(1)-620U(S) to a base station or other communications system.

Note that the downlink optical fiber-based communications medium 612D and the uplink optical fiber-based communications medium 612U connected to each of the remote units 614(1)-614(S) may be a common optical fiber-based communications medium, wherein for example, wave division multiplexing (WDM) is employed to provide the downlink optical fiber-based communications signals 610D(1)-610D(R) and the uplink optical fiber-based communications signals 610U(1)-610U(S) on the same optical fiber-based communications medium.

Figure 7:
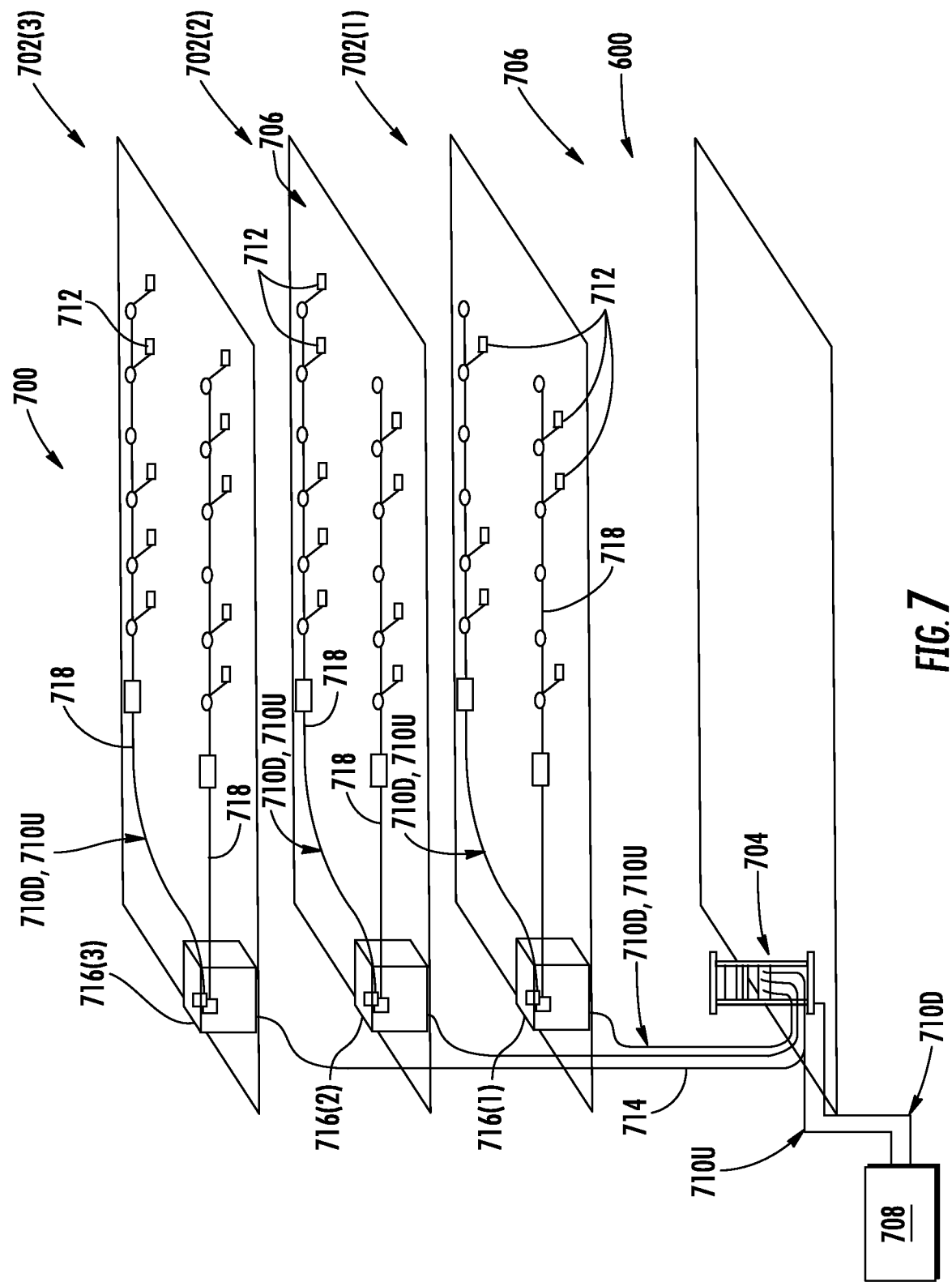
FIG. 7 is a partial schematic cut-away diagram of an exemplary building infrastructure in which a WDS, such as the WDS of FIG. 6, including one or more remote units, may employ the power amplifier calibration circuit of FIG. 3 to help optimize the first power amplifier performance parameter and the second power amplifier performance parameter concurrently.

The WDS 600 of FIG. 6 may be provided in an indoor environment, as illustrated in FIG. 7. FIG. 7 is a partial schematic cut-away diagram of an exemplary building infrastructure 700 in which a WDS, such as the WDS 600 of FIG. 6, including one or more remote units, may employ the power amplifier calibration circuit 300 of FIG. 3 to help optimize the first power amplifier performance parameter and the second power amplifier performance parameter concurrently. The building infrastructure 700 in this embodiment includes a first (ground) floor 702(1), a second floor 702(2), and a third floor 702(3). The floors 702(1)-702(3) are serviced by a central unit 704 to provide antenna coverage areas 706 in the building infrastructure 700. The central unit 704 is communicatively coupled to a base station 708 to receive downlink communications signals 710D from the base station 708. The central unit 704 is communicatively coupled to a plurality of remote units 712 to distribute the downlink communications signals 710D to the remote units 712 and to receive uplink communications signals 710U from the remote units 712, as previously discussed above. The downlink communications signals 710D and the uplink communications signals 710U communicated between the central unit 704 and the remote units 712 are carried over a riser cable 714. The riser cable 714 may be routed through interconnect units (ICUs) 716(1)-716(3) dedicated to each of the floors 702(1)-702(3) that route the downlink communications signals 710D and the uplink communications signals 710U to the remote units 712 and also provide power to the remote units 712 via array cables 718.

Figure 8:
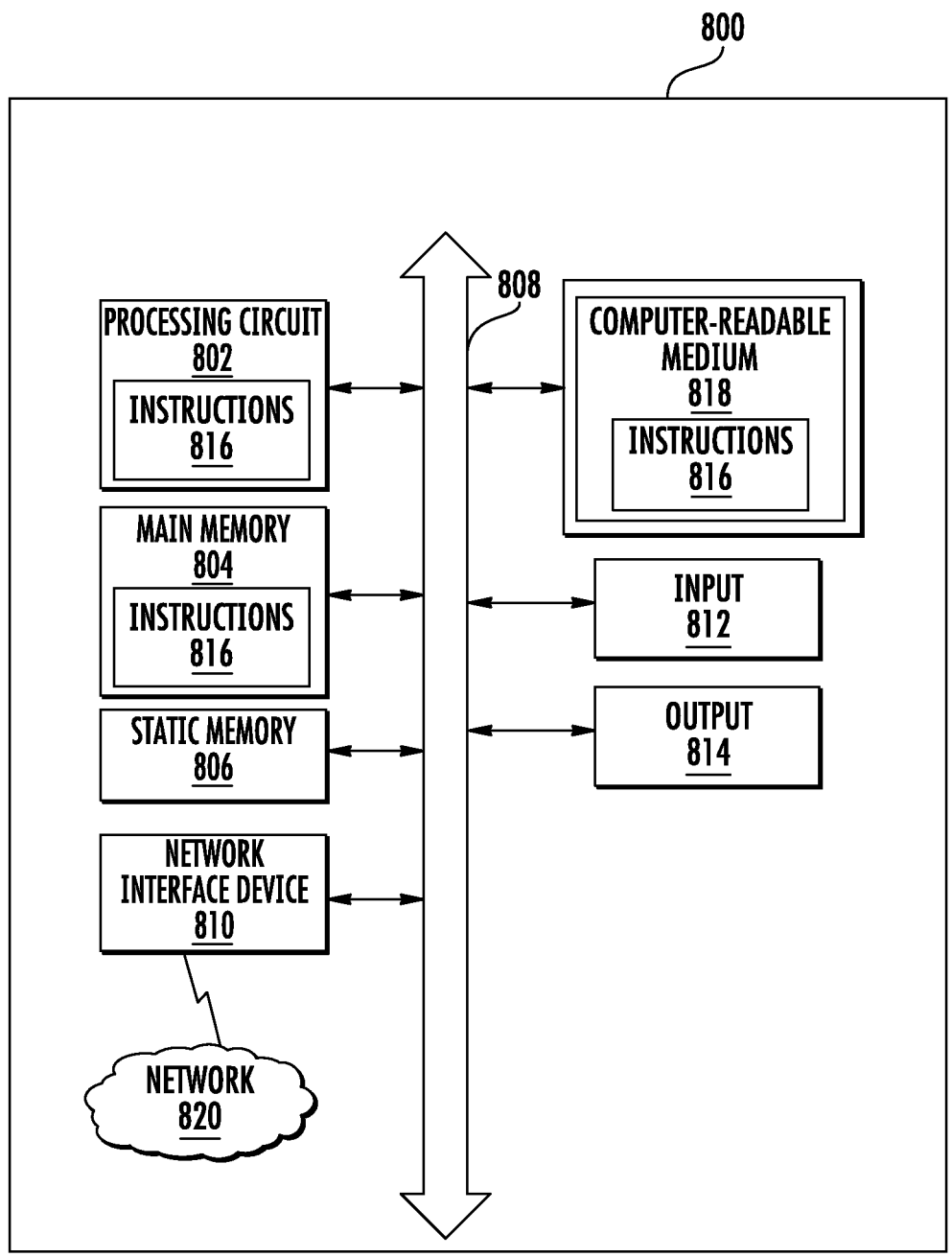
FIG. 8 is a schematic diagram representation of additional detail illustrating an exemplary computer system that could be employed in a controller, including a control circuit in the power amplifier calibration circuit of FIG. 3 for determining a selected bias signal combination among a plurality of bias signal combinations.

FIG. 8 is a schematic diagram representation of additional detail illustrating an exemplary computer system 800 that could be employed in a controller, including the control circuit 326 in the power amplifier calibration circuit 300 of FIG. 3 for determining the selected bias signal combination among the bias signal combinations 304(1)-304(N). In this regard, the computer system 800 is adapted to execute instructions from an exemplary computer-readable medium to perform these and/or any of the functions or processing described herein.

In this regard, the computer system 800 in FIG. 8 may include a set of instructions that may be executed to predict frequency interference to avoid or reduce interference in a multi-frequency distributed antenna system (DAS). The computer system 800 may be connected (e.g., networked) to other machines in a local area network (LAN), an intranet, an extranet, or the Internet. While only a single device is illustrated, the term "device" shall also be taken to include any collection of devices that individually or jointly execute a set (or multiple sets) of instructions to perform any one or more of the methodologies discussed herein. The computer system 800 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server or a user's computer.

The exemplary computer system 800 in this embodiment includes a processing circuit or processor 802, a main memory 804 (e.g., read-only memory (ROM), flash memory, dynamic random access memory (DRAM), such as synchronous DRAM (SDRAM), etc.), and a static memory 806 (e.g., flash memory, static random access memory (SRAM), etc.), which may communicate with each other via a data bus 808. Alternatively, the processor 802 may be connected to the main memory 804 and/or the static memory 806 directly or via some other connectivity means. The processor 802 may be a controller, and the main memory 804 or the static memory 806 may be any type of memory.

The processor 802 represents one or more general-purpose processing devices, such as a microprocessor, central processing unit, or the like. More particularly, the processor 802 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processor 802 is configured to execute processing logic in instructions for performing the operations and steps discussed herein.

The computer system 800 may further include a network interface device 810. The computer system 800 also may or may not include an input 812, configured to receive input and selections to be communicated to the computer system 800 when executing instructions. The computer system 800 also may or may not include an output 814, including, but not limited to, a display, a video display unit (e.g., a liquid crystal display (LCD) or a cathode ray tube (CRT)), an alphanumeric input device (e.g., a keyboard), and/or a cursor control device (e.g., a mouse).

The computer system 800 may or may not include a data storage device that includes instructions 816 stored in a computer-readable medium 818. The instructions 816 may also reside, completely or at least partially, within the main memory 804 and/or within the processor 802 during execution thereof by the computer system 800, the main memory 804 and the processor 802 also constituting a computer-readable medium. The instructions 816 may further be transmitted or received over a network 820 via the network interface device 810.

While the computer-readable medium 818 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A communications system, comprising:
   at least one remote unit configured to:
      convert a plurality of downlink digital communications signals into a plurality of downlink radio frequency (RF) communications signals for distribution to client devices; and
      receive a plurality of uplink RF communications signals from the client devices and convert the plurality of uplink RF communications signals into a plurality of uplink digital communications signals; and
   a central unit configured to:
      distribute the plurality of downlink digital communications signals to the at least one remote unit; and
      receive the plurality of uplink digital communications signals from the at least one remote unit,
      wherein the central unit comprises at least one electrical-to-optical (E/O) converter configured to convert the plurality of downlink digital communications signals into optical signals;
   wherein at least one selected remote unit comprises a power amplifier calibration circuit, the power amplifier calibration circuit comprising:
      a power amplifier comprising a signal input, a signal output, a first bias signal input, and a second bias signal input, wherein the power amplifier is configured to:
         receive an input signal having a first power at the signal input;
         receive a first bias signal at the first bias signal input;
         receive a second bias signal at the second bias signal input;

amplify the input signal to generate an output signal having a second power higher than the first power at the signal output; and control a first power amplifier performance parameter and a second power amplifier performance parameter in the output signal based on the first bias signal and the second bias signal; and a control circuit configured to:

provide a plurality of bias signal combinations to the power amplifier, wherein each of the plurality of bias signal combinations comprises a respective first bias signal and a respective second bias signal to be provided to the first bias signal input and the second bias signal input of the power amplifier, respectively;

receive a plurality of performance indication signals comprising a plurality of measurements corresponding to the plurality of bias signal combinations, respectively, wherein each of the plurality of measurements comprises the first power amplifier performance parameter and the second power amplifier performance parameter;

rank the plurality of measurements based on a ranking criterion; and determine a selected bias signal combination among the plurality of bias signal combinations corresponding to a selected ranked measurement among the plurality of measurements.

2. The communications system of claim 1, wherein:
the first bias signal is represented by a first digital word; and
the second bias signal is represented by a second digital word.

3. The communications system of claim 1, wherein the control circuit is further configured to control the power amplifier to operate based on the selected bias signal combination.

4. The communications system of claim 1, wherein the power amplifier is further configured to:
receive a modulated broadband input signal at the signal input, wherein the modulated broadband input signal comprises a first signal in a first signal frequency and a second signal in a second signal frequency; and
generate a modulated broadband output signal at the signal output, wherein the modulated broadband output signal comprises the first signal and the second signal.

5. The communications system of claim 1, wherein the power amplifier is further configured to:
receive the input signal from a signal generator communicatively coupled to the power amplifier; and
provide the output signal to a spectrum analyzer communicatively coupled to the power amplifier and the control circuit.

6. The communications system of claim 1, wherein:
the first power amplifier performance parameter corresponds to a third-order intermodulation (IMD3) of the output signal;
the second power amplifier performance parameter corresponds to an adjacent channel power ratio (ACPR) of the output signal; and
the power amplifier is further configured to control the IMD3 and the ACPR of the output signal based on the first bias signal and the second bias signal.

7. An optical fiber-based wireless distribution system (WDS), comprising:
a plurality of cables including at least one optical communications medium; and a plurality of remote units comprising optical-to-electrical (O/E) converters and configured to:
receive and convert a plurality of downlink digital communications signals into a plurality of downlink radio frequency (RF) communications signals for distribution to client devices; and
receive a plurality of uplink RF communications signals from the client devices and convert the plurality of uplink RF communications signals into a plurality of optical uplink digital communications signals;

wherein at least one selected remote unit among the plurality of remote units comprises a power amplifier calibration circuit, the power amplifier calibration circuit comprising:
a power amplifier comprising a signal input, a signal output, a first bias signal input, and a second bias signal input, wherein the power amplifier is configured to:
receive an input signal having a first power at the signal input;
receive a first bias signal at the first bias signal input;
receive a second bias signal at the second bias signal input;
amplify the input signal to generate an output signal having a second power higher than the first power at the signal output; and
control a first power amplifier performance parameter and a second power amplifier performance parameter in the output signal based on the first bias signal and the second bias signal; and a control circuit configured to:
provide a plurality of bias signal combinations to the power amplifier, wherein each of the plurality of bias signal combinations comprises a respective first bias signal and a respective second bias signal to be provided to the first bias signal input and the second bias signal input of the power amplifier, respectively;
receive a plurality of performance indication signals comprising a plurality of measurements corresponding to the plurality of bias signal combinations, respectively, wherein each of the plurality of measurements comprises the first power amplifier performance parameter and the second power amplifier performance parameter;
rank the plurality of measurements based on a ranking criterion; and
determine a selected bias signal combination among the plurality of bias signal combinations corresponding to a selected ranked measurement among the plurality of measurements.

8. The WDS of claim 7, wherein the control circuit is further configured to control operation of the at least one selected remote unit.

9. The WDS of claim 7, wherein:
the first bias signal is represented by a first digital word; and
the second bias signal is represented by a second digital word.

10. The WDS of claim 7, wherein the control circuit is further configured to control the power amplifier to operate based on the selected bias signal combination.

11. The WDS of claim 7, wherein the power amplifier is further configured to:
receive a modulated broadband input signal at the signal input, wherein the modulated broadband input signal comprises a first signal in a first signal frequency and a second signal in a second signal frequency; and generate a modulated broadband output signal at the signal output, wherein the modulated broadband output signal comprises the first signal and the second signal.

12. The WDS of claim 7, wherein the power amplifier is further configured to:
receive the input signal from a signal generator communicatively coupled to the power amplifier; and
provide the output signal to a spectrum analyzer communicatively coupled to the power amplifier and the control circuit.

13. The WDS of claim 7, wherein:
the first power amplifier performance parameter corresponds to a third-order intermodulation (IMD3) of the output signal;
the second power amplifier performance parameter corresponds to an adjacent channel power ratio (ACPR) of the output signal; and
the power amplifier is further configured to control the IMD3 and the ACPR of the output signal based on the first bias signal and the second bias signal.

14. A communications system, comprising:
a plurality of remote units comprising optical-to-electrical (O/E) converters and configured to:
convert a plurality of downlink digital communications signals into a plurality of downlink radio frequency (RF) communications signals; and
receive a plurality of uplink RF communications signals and convert the plurality of uplink RF communications signals into a plurality of uplink digital communications signals; and
a central unit configured to:
distribute the plurality of downlink digital communications signals to the plurality of remote units; and
receive the plurality of uplink digital communications signals from the plurality of remote units,
wherein the central unit comprises at least one electrical-to-optical converter configured to convert the plurality of downlink digital communications signals into optical signals;
wherein at least one selected remote unit among the plurality of remote units comprises a power amplifier calibration circuit, the power amplifier calibration circuit comprising:
a power amplifier comprising a signal output, a first bias signal input, and a second bias signal input, wherein the power amplifier is configured to:
receive an input signal having a first power;
receive a first bias signal at the first bias signal input;
receive a second bias signal at the second bias signal input;
amplify the input signal to generate an output signal having a second power higher than the first power at the signal output; and
control a first power amplifier performance parameter and a second power amplifier performance parameter in the output signal based on the first bias signal and the second bias signal; and
a control circuit configured to:
provide a plurality of bias signal combinations to the power amplifier, wherein each of the plurality of bias signal combinations comprises a respective first bias signal and a respective second bias signal to be provided to the first bias signal input and the second bias signal input of the power amplifier, respectively;
receive a plurality of performance indication signals comprising a plurality of measurements corresponding to the plurality of bias signal combinations, respectively, wherein each of the plurality of measurements comprises the first power amplifier performance parameter and the second power amplifier performance parameter;
rank the plurality of measurements based on a predefined ranking criterion; and
determine a selected bias signal combination among the plurality of bias signal combinations corresponding to a selected ranked measurement among the plurality of measurements.

15. The communications system of claim 14, wherein the control circuit is further configured to control operation of the at least one selected remote unit.

16. The communications system of claim 14, wherein:
the first bias signal is represented by a first digital word; and
the second bias signal is represented by a second digital word.

17. The communications system of claim 14, wherein the power amplifier is further configured to:
receive a modulated broadband input signal at a signal input, wherein the modulated broadband input signal comprises a first signal in a first signal frequency and a second signal in a second signal frequency; and
generate a modulated broadband output signal at the signal output, wherein the modulated broadband output signal comprises the first signal and the second signal.

18. The communications system of claim 14, wherein the power amplifier is further configured to:
receive the input signal from a signal generator communicatively coupled to the power amplifier; and
provide the output signal to a spectrum analyzer communicatively coupled to the power amplifier and the control circuit.

19. The communications system of claim 14, wherein:
the first power amplifier performance parameter corresponds to a third-order intermodulation (IMD3) of the output signal;
the second power amplifier performance parameter corresponds to an adjacent channel power ratio (ACPR) of the output signal; and
the power amplifier is further configured to control the IMD3 and the ACPR of the output signal based on the first bias signal and the second bias signal.

* * * * *